(12) United States Patent
Oakeson et al.

(10) Patent No.: US 6,456,123 B1
(45) Date of Patent: Sep. 24, 2002

(54) METHOD AND APPARATUS FOR TRANSFERRING A DIFFERENTIAL VOLTAGE TO A GROUND REFERENCED VOLTAGE USING A SAMPLE/HOLD CAPACITOR

(75) Inventors: Dale A. Oakeson, Midvale, UT (US); Don R. Sauer, San Jose, CA (US)

(73) Assignee: National Semiconductor Corporation

( * ) Notice: Subject to any disclaimer, the term of this patent is extended or adjusted under 35 U.S.C. 154(b) by 0 days.

(21) Appl. No.: 09/633,923

(22) Filed: Aug. 8, 2000

(51) Int. Cl.[7] ............................................... H03K 5/00
(52) U.S. Cl. ........................................... 327/91; 327/94
(58) Field of Search ............................. 327/91, 94, 93, 327/65, 96, 407, 337

(56) References Cited

U.S. PATENT DOCUMENTS

| | | | |
|---|---|---|---|
| 4,550,424 A | | 10/1985 | Cheng et al. .................. 381/15 |
| 4,962,325 A | * | 10/1990 | Miller et al. ................... 327/95 |
| 5,821,780 A | * | 10/1998 | Hasegawa ..................... 327/63 |
| 5,835,045 A | * | 11/1998 | Ogawa et al. ............... 341/155 |
| 5,894,284 A | * | 4/1999 | Garrity et al. ............... 341/172 |

* cited by examiner

Primary Examiner—Tuan T. Lam
Assistant Examiner—Hiep Nguyen
(74) Attorney, Agent, or Firm—Merchant & Gould P.C.; John W. Branch

(57) ABSTRACT

A translation circuit for transferring a differential voltage to a ground referenced voltage includes a differential input circuit, a sample/hold (S/H) circuit, and a compensation circuit. The S/H circuit includes a S/H capacitor, a series capacitor and a switch. The S/H and series capacitors are connected in series between an output line and a source of ground potential (GROUND). The switch shorts the bottom electrode of the S/H capacitor to GROUND when executing a translation operation. The differential input circuit receives the differential voltage and selectively provides the differential voltage across the S/H capacitor so that the top and bottom electrodes of the S/H capacitor have voltages V+ and V−, respectively. Parasitic capacitance tends to add charge to the S/H capacitor during the translation operation. The compensation circuit compensates for parasitic capacitance by removing, ideally, the same amount of charge from the S/H capacitor by the end of the translation operation.

18 Claims, 13 Drawing Sheets

METHOD AND APPARATUS FOR TRANSFERRING A DIFFERENTIAL VOLTAGE TO A GROUND REFERENCED VOLTAGE USING A SAMPLE/HOLD CAPACITOR

BACKGROUND INFORMATION

Some electronics applications require translation of a differential voltage to a ground referenced voltage. The trend in the electronics industry is to reduce the size and power consumption of electronic devices. In general, as device sizes decrease (e.g., sub micron technology devices), the effect of parasitic or stray capacitances and currents in the device become more problematic. Sub micron differential-to-ground referenced voltage translation circuits are no exception. In this type of circuit, parasitic capacitances can lead to significant voltage level inaccuracies in the translation process. In some conventional circuits, these inaccuracies can exceed the relatively strict tolerances required in many current electronic applications. Therefore, there is a need for differential-to-ground referenced voltage translation circuit with reduced susceptibility to inaccuracies caused by parasitics.

SUMMARY

In accordance with the present invention, a translation circuit for transferring a differential voltage to a ground referenced voltage using a sample/hold capacitor is provided. The translation circuit is configured to sample and hold a differential voltage signal, and then translate the differential voltage signal sample into a ground-referenced voltage signal. In one aspect of the invention, the translation circuit includes a differential input circuit, a sample/hold (S/H) circuit, and a compensation circuit. The S/H circuit includes a S/H capacitor, a series capacitor and a switch. The S/H and series capacitors are connected in series between an output line and a source of ground potential (GROUND). The switch shorts the bottom electrode of the S/H capacitor to GROUND when executing a translation operation. The differential input circuit receives the differential voltage signal and selectively provides the differential voltage across the S/H capacitor so that the top and bottom electrodes of the S/H capacitor have voltages V+ and V−, respectively. Parasitic capacitance tends to add charge to the S/H capacitor during the translation operation. The compensation circuit compensates for parasitic capacitance by removing, ideally, the same amount of charge from the S/H capacitor by the end of the translation operation.

In further aspect of the invention, the differential input circuit includes two switches (i.e. first and second switches) to selectively isolate the S/H circuit from the differential signal lines. The compensation circuit includes two switches (i.e., third and fourth switches) and a trim capacitor. The trim capacitor is connected in parallel with the S/H capacitor through the two switches of the compensation circuit. A timing circuit is configured to provide control signals to operate the switches.

In operation, the S/H and trim capacitors are charged to the differential voltage and then isolated from the differential voltage lines by opening the first and second switches. The third switch then connects bottom electrode of the trim capacitor to GROUND. Consequently, the voltage at the bottom electrode of the trim capacitor is pulled from V− to 0 volts, causing charge to flow from the S/H capacitor to the trim capacitor. A relatively small amount of charge also flows from the parasitic capacitance. Then the fourth switch is opened to isolate the trim capacitor from the S/H capacitor. The switch of the S/H circuit (i.e., the fifth switch) is then closed to short the series capacitor and connect the bottom electrode of the S/H capacitor to GROUND. Consequently, the voltage at the bottom electrode of the S/H capacitor is pulled from V− to 0 volts, causing charge to flow from the parasitic capacitance to the S/H capacitor.

In accordance with this aspect of the invention, the trim capacitor is sized to compensate for the parasitic capacitances in the translation circuit. The trim capacitor is sized to have approximately the same capacitance value as that of the parasitic capacitance so that the amount of charge that flows from the parasitic capacitance when pulling the voltage of the bottom electrode of the S/H capacitor from V− to 0 volts will be the same as the amount of charge that flows from the trim capacitor when pulling the voltage at the bottom electrode of the trim capacitor from V− to 0 volts.

DETAILED DESCRIPTION

Figure 1:
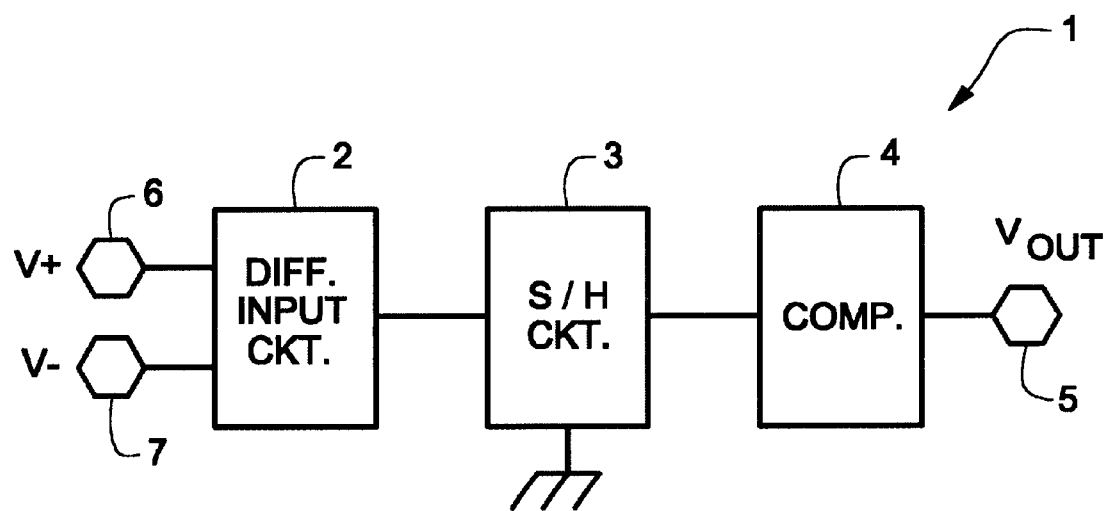
FIG. 1 is a diagram illustrating a simplified functional block diagram of a differential-to-ground referenced translation circuit, according to one embodiment of the present invention.

FIG. 1 illustrates a simplified functional block diagram of a differential-to-ground referenced translation circuit 1, according to one embodiment of the present invention. In this embodiment, the translation circuit "samples and holds" a differential voltage signal, and then translates the differential sample into a ground-referenced voltage. In general form, translation circuit 1 includes a differential input circuit 2, a sample/hold (S/H) circuit 3, and a compensation circuit 4. S/H circuit 2 includes a S/H capacitor, a series capacitor and a switch (see FIG. 2). The S/H and series capacitors are connected between an output line 5 and a source of ground potential (GROUND). The switch shorts the bottom electrode of the S/H capacitor to GROUND when executing a translation operation. Differential input circuit 2 receives the differential signal via lines 6 and 7 and selectively provides the differential voltage (i.e., voltage V+ voltage V−) across the S/H capacitor so that the top and bottom electrodes of the S/H capacitor have voltages V+ and V−, respectively. Parasitic capacitance (not shown but inherent in typical semiconductor devices) tends to add charge to the S/H capacitor during the translation operation. The compensation circuit compensates for parasitic capacitance by removing, ideally, the same amount of charge from the S/H capacitor by the end of the translation operation. One implementation of translation circuit 1 is described below.

Figure 2:
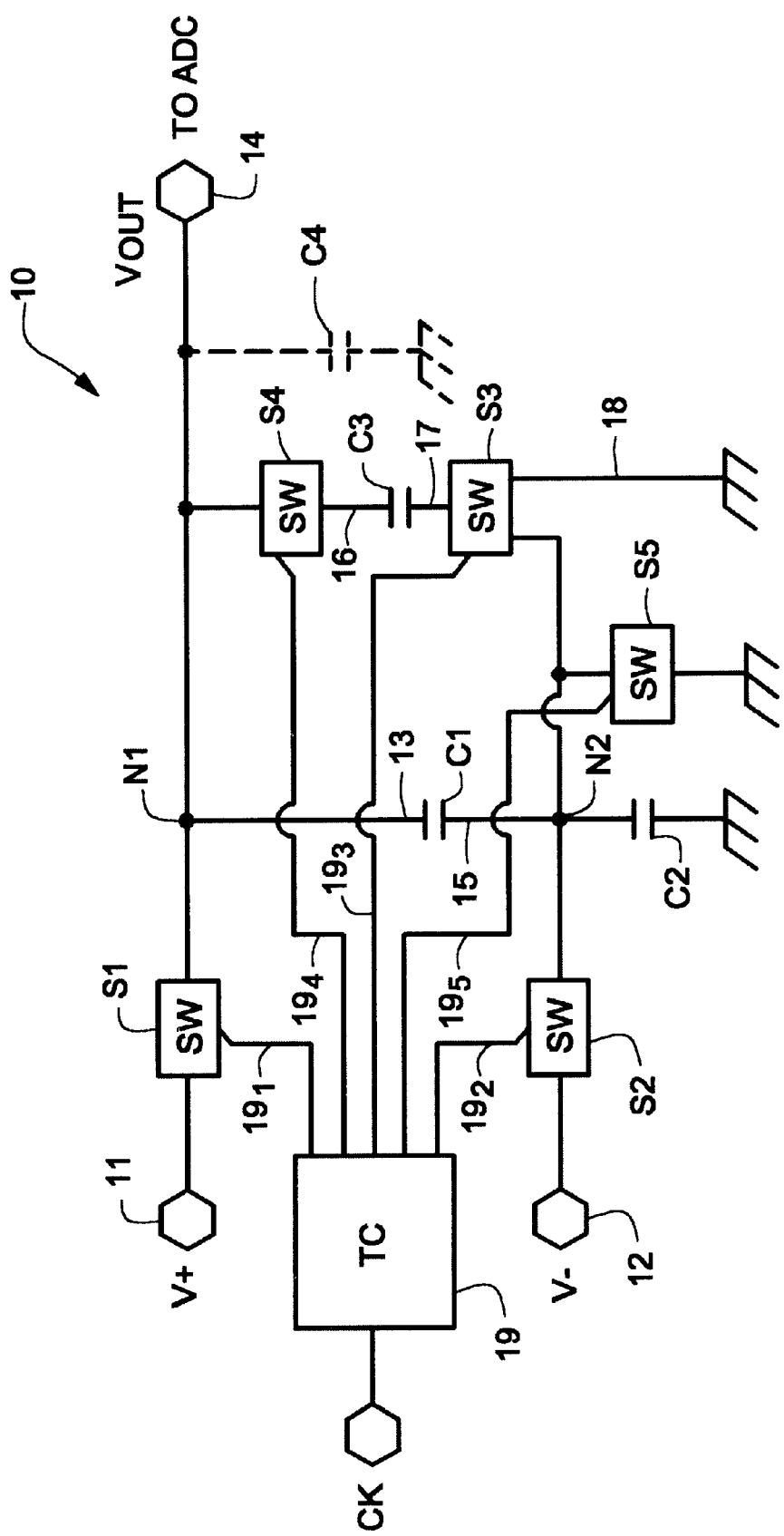
FIG. 2 is a diagram illustrating a block diagram of an implementation of the circuit of FIG. 1, according to one embodiment of the present invention.

FIG. 2 illustrates a translation circuit 10 implementing the block diagram of FIG. 1, according to one embodiment of the present invention. Translation circuit 10 includes capacitors C1–C3, switches S1–S5, a differential signal line pair (i.e., a V+ line 11 and a V− line 12), output line 14 and a timing circuit 19. The parasitic capacitance between output line 14 and GROUND is modeled as capacitor C4, which is shown in phantom in FIG. 2.

The elements of translation circuit 10 are interconnected as follows. Switch S1 is connected to the V+ line 11 and to output line 14. Capacitor C1 is the S/H capacitor, having a top electrode 13 connected to output line 14. The bottom electrode 15 of S/H capacitor C1 is connected to a node N2. Node N2 is connected to the V− line 12 through switch S2. Capacitor C2 is the series capacitor, coupling node N2 to GROUND. Capacitor C3 is the trim capacitor, having top and bottom electrodes 16 and 17 connected to switches S4 and S3, respectively. Switch S4 connects top electrode 16 to output line 14. Switch S3 connects bottom electrode 17 to either node N2 or to a line 18 that is in turn connected to GROUND. Switch S5 is connected between node N2 and GROUND. Timing circuit 19 is connected to receive a clock signal CK and is connected to switches S1–S5 via control lines $19_1$–$19_5$, respectively.

In accordance with the invention, trim capacitor C3 is sized to compensate for parasitic capacitance C4 in translation circuit 10. Ideally, trim capacitor C3 is sized so that the amount of charge that redistributes in parasitic capacitance C4 when driving the voltage level of bottom electrode 15 of S/H capacitor C1 from V− volts to ground potential will be the same as the amount of charge that redistributes in trim capacitor C3 when driving the voltage level of bottom electrode 17 of trim capacitor from V− volts to ground potential. One skilled in the art, in view of the present disclosure, can predict the value of the parasitic capacitance using commercially available design and simulation tools. The value of the trim capacitance should also take into account the capacitance inherent in devices used to implement translation circuit 10. In other embodiments, trim capacitor C3 can be programmable using, for example, mask programming, laser trimming, EPROM, EEPROM, and other suitable hardware programming techniques. The operation of translation circuit 10 is described below in conjunction with FIGS. 3–8.

Figure 3:
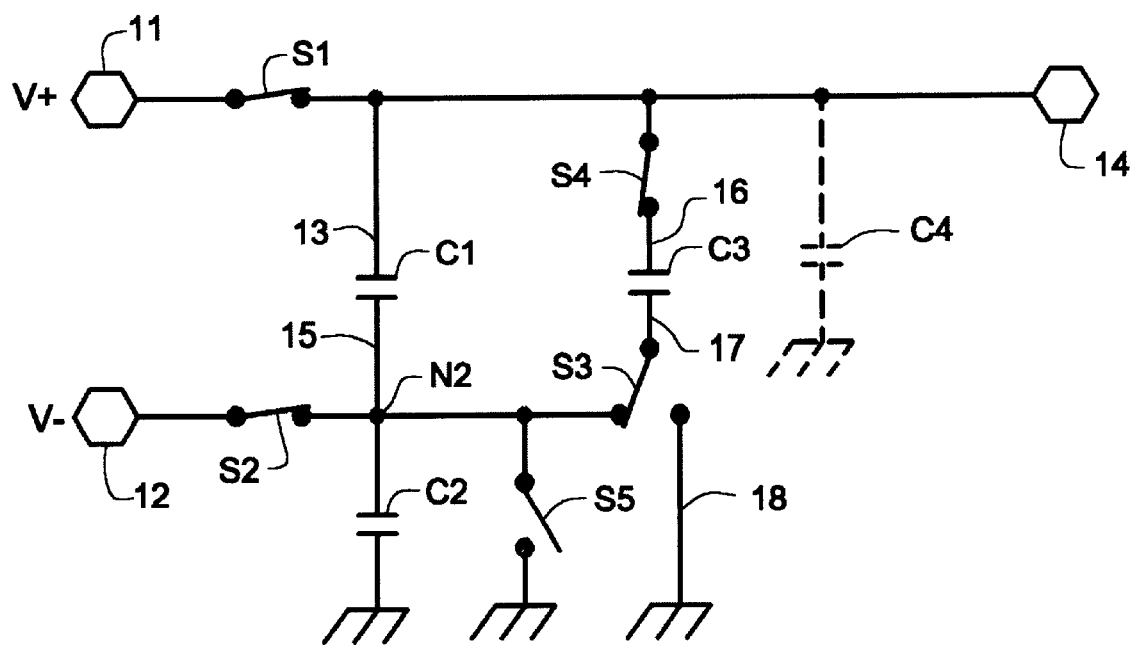
FIG. 3 is a diagram schematically illustrating the circuit of FIG. 2 at a first stage of operation.

FIG. 3 schematically illustrates translation circuit 10 (FIG. 2) at a first stage of operation. In this stage, timing circuit 19 (FIG. 2) provides control signals via lines $19_1$–$19_5$ such that switches S1, S2 and S4 are closed, switch S5 is open, and switch S3 electrically connects bottom electrode 17 of trim capacitor C3 to node N2. Because switches S1 and S2 are closed, the differential signal is passed through to output line 14 and node N2. In this embodiment, the differential signal changes at a low rate compared to the sample and hold operation so that the differential signal is relatively constant during the sample and hold operation. As a result, the differential signal charges (or discharges, depending on the initial voltage across capacitors C1 and C3) capacitors C1 and C3, causing top electrodes 13 and 16 to reach a level equal to voltage V+ bottom electrodes 15 and 17 to reach a level equal to voltage V−. While charge is redistributed in capacitors C1 and C3, series capacitor C2 is charged (or discharged) to reach a level equal to voltage V− and parasitic capacitance C4 is charged (or discharged) to the voltage V+.

Figure 4:
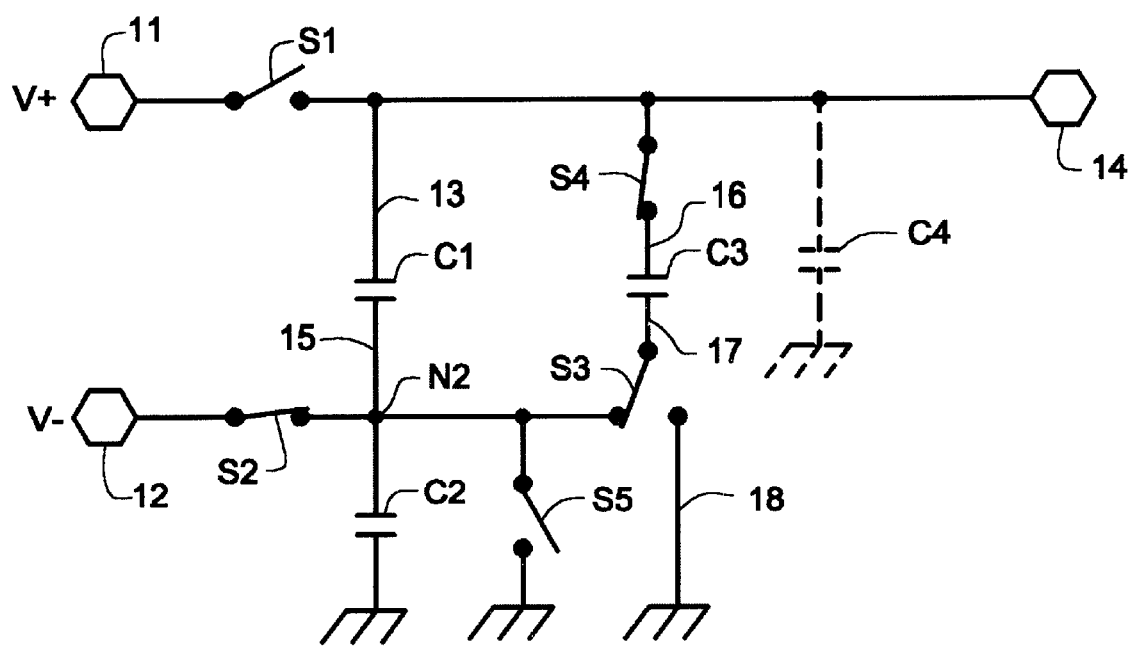
FIG. 4 is a diagram schematically illustrating the circuit of FIG. 2 at a second stage of operation.

FIG. 4 schematically illustrates translation circuit 10 (FIG. 2) at a second stage of operation. In this second stage, timing circuit 19 (FIG. 2) causes switch S1 to open, thereby isolating output line 14 and top electrodes 13 and 16 (capacitors C1 and C3, respectively) from V+ line 11. This operation sets the voltage level of top electrodes 13 and 16 at voltage V+. This operation also sets the voltage level across parasitic capacitance C4 at voltage V+.

Figure 5:
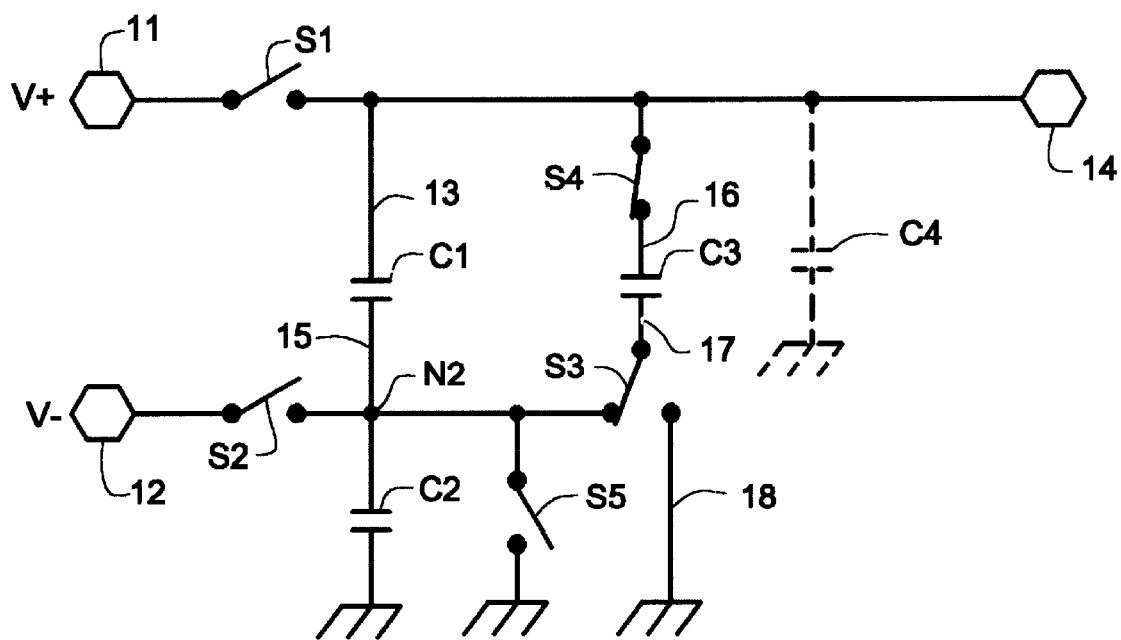
FIG. 5 is a diagram schematically illustrating the circuit of FIG. 2 at a third stage of operation.

FIG. 5 schematically illustrates translation circuit 10 (FIG. 2) at a third stage of operation. This stage occurs after a first predetermined time period (i.e., delay D1) triggered at the start of the previous stage. The duration of delay D1 is set to ensure that the top electrodes of capacitors C1 and C3 are fully isolated from V+ line 11 before beginning this stage. After delay D1, timing circuit 19 (FIG. 2) causes switch S2 to open, thereby isolating node N2 from V− line 12. This operation sets the voltage level of bottom electrodes 15 and 17 (of capacitors C1 and C3, respectively) at voltage V−.

Figure 6:
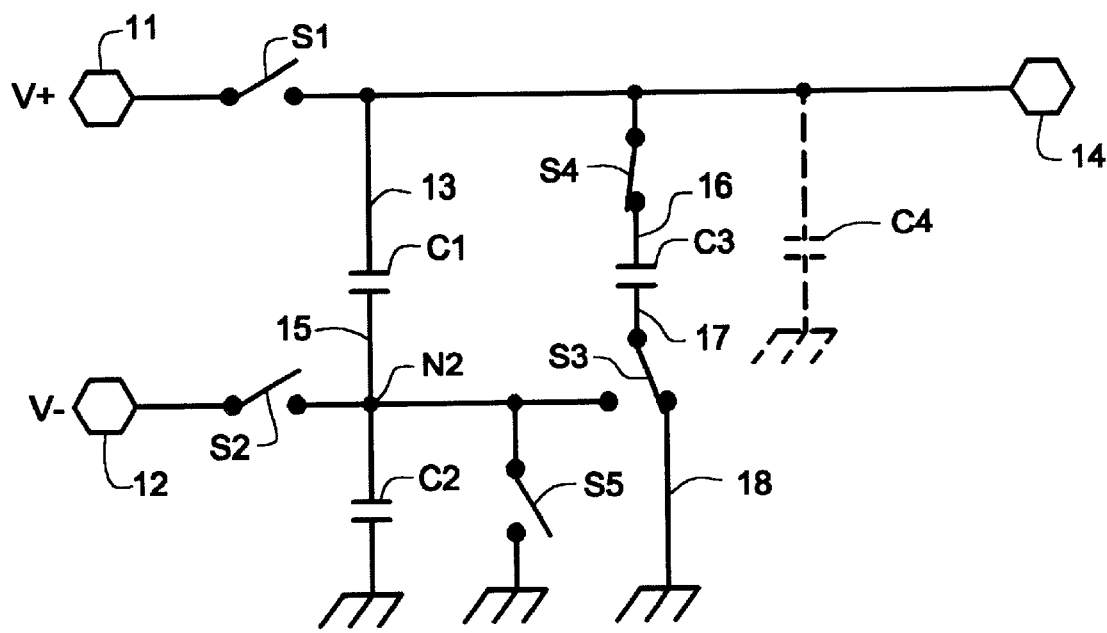
FIG. 6 is a diagram schematically illustrating the circuit of FIG. 2 at a fourth stage of operation.

FIG. 6 schematically illustrates translation circuit 10 (FIG. 2) at a fourth stage of operation. This stage occurs after a second predetermined period (i.e., delay D2) triggered at the start of the previous stage. The duration of delay D2 is set to ensure that the bottom electrodes of capacitors C1 and C3 are fully isolated from V− line 13 before beginning this stage. After delay D2, timing circuit 19 (FIG. 2) causes switch S3 to electrically disconnect bottom electrode 17 of trim capacitor C3 from node N2 and electrically connect bottom electrode 17 to line 18 (and thus to GROUND). As a result of the change in voltage at bottom electrode 17, charge stored by trim capacitor C3 is redistributed. For example, if voltage V− is a positive voltage, when electrode 17 is electrically connected to GROUND, the change in voltage level at bottom electrode 17 causes charge from S/H capacitor C1 and parasitic capacitance C4 to redistribute. As a result of this charge redistribution, the voltage level at output line 14 drops below V+ volts. As is described further below, this voltage level drop is desirable in that it is used to compensate for a voltage level increase at output line 14 caused by parasitic capacitance C4.

Figure 7:
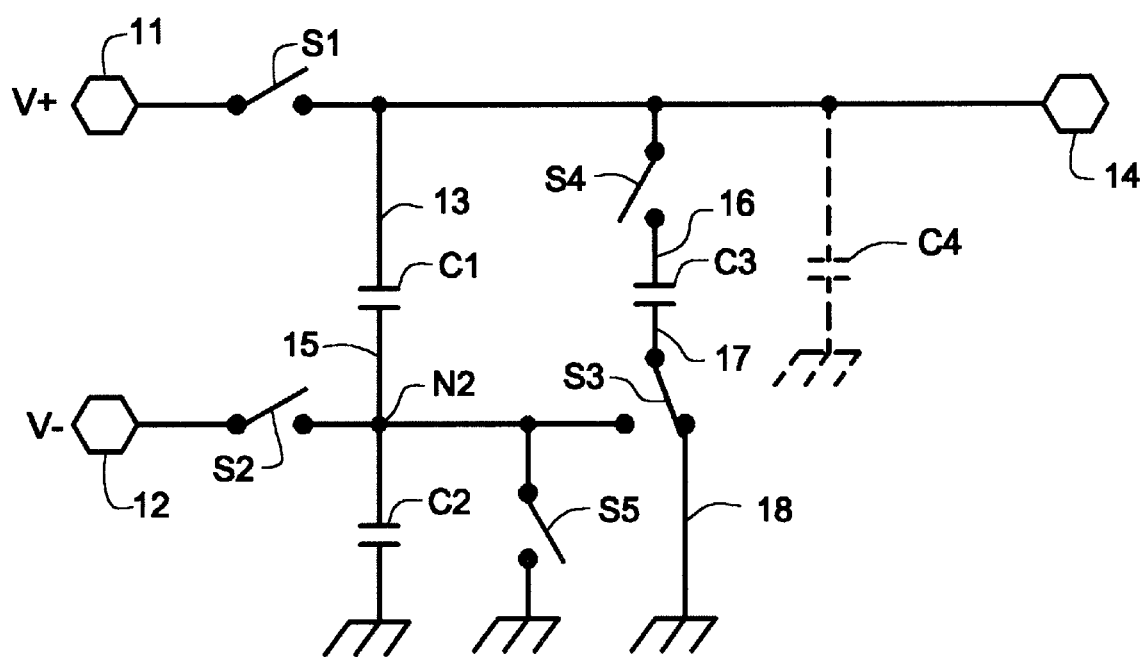
FIG. 7 is a diagram schematically illustrating the circuit of FIG. 2 at a fifth stage of operation.

FIG. 7 schematically illustrates translation circuit 10 (FIG. 2) at a fifth stage of operation. This stage occurs after a third predetermined period (i e., delay D3) triggered at the start of the previous stage. The duration of delay D3 is set to ensure that the charge redistribution described above in conjunction with FIG. 6 is completed. After delay D3, timing circuit 19 (FIG. 2) causes switch S4 to open, thereby isolating trim capacitor C3 from output line 14.

Figure 8:
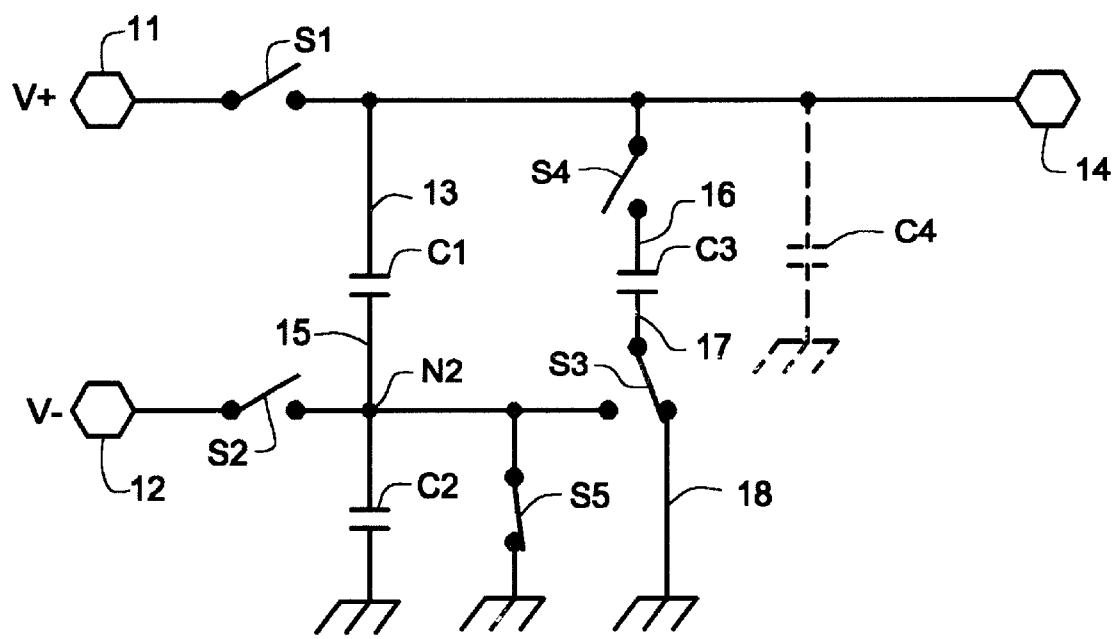
FIG. 8 is a diagram schematically illustrating the circuit of FIG. 2 at a sixth stage of operation.

FIG. 8 schematically illustrates translation circuit 10 (FIG. 2) at a sixth stage of operation. This stage occurs after a fourth predetermined period (i.e., delay D4) triggered at the start of the previous stage. The duration of delay D4 is set to ensure that trim capacitor C3 is fully isolated from output line 14 before beginning this stage. After delay D4, timing circuit 19 (FIG. 2) causes switch S5 to close, thereby electrically connecting node N2 (and consequently, bottom electrode 15 of S/H capacitor C1) to GROUND. As a result of the change in voltage at bottom electrode 15, charge stored by S/H capacitor C1 is redistributed. Ideally (i.e., without parasitic capacitance), the change in voltage at bottom electrode 15 would cause an identical change in voltage level at top electrode 13, thereby resulting in a direct translation of the differential voltage to a ground-referenced voltage.

However in practice, the change in voltage level at bottom electrode 15 causes charge from parasitic capacitance C4 to redistribute to S/H capacitor C1. As a result of this charge redistribution from parasitic capacitance C4, the voltage level at output line 14 does not drop as much as the voltage drop at bottom electrode 15 when bottom electrode 15 is electrically connected to GROUND. In effect, when voltage V+ is positive, the parasitic capacitance undesirably increases the voltage at output line 14. However, in accordance with the present invention, this inaccuracy is compensated for by trim capacitor C3 as described above in conjunction with FIG. 6. That is, trim capacitor C3 is ideally sized so that after its bottom electrode is switched from node N2 to GROUND, trim capacitor C3 pulls charge from S/H capacitor C1 in an amount equal to the charge added by the parasitic capacitance when the bottom electrode of S/H capacitor C1 is switched from node N2 to GROUND. Consequently, the translation of the differential voltage to a ground-referenced voltage is more accurate relative to a translation circuit that does not use a trim capacitor. Table 1 below provides the delays and capacitance values for one embodiment of the present invention. These values are based on a predicted parasitic capacitance of 150 fF. In view of this disclosure, those skilled in the art will appreciate that the parasitic capacitance and other capacitor values depend on the application, the circuit layout, and device parameters that vary with fabrication process.

TABLE 1

| | |
|---|---|
| Capacitor C1 | 12 pF |
| Capacitor C2 | 1 pF |
| Capacitor C3 | 200 fF |
| Delay D1 | 2.5 ns |
| Delay D2 | 2.5 ns |
| Delay D3 | 11 ns |
| Delay D2 | 4 ns |

Although the terms "first stage", "second stage" and so on are used in this description, in other embodiments there may be one or more other stages, which may be before, after and/or between the above-described stages.

Figure 9:
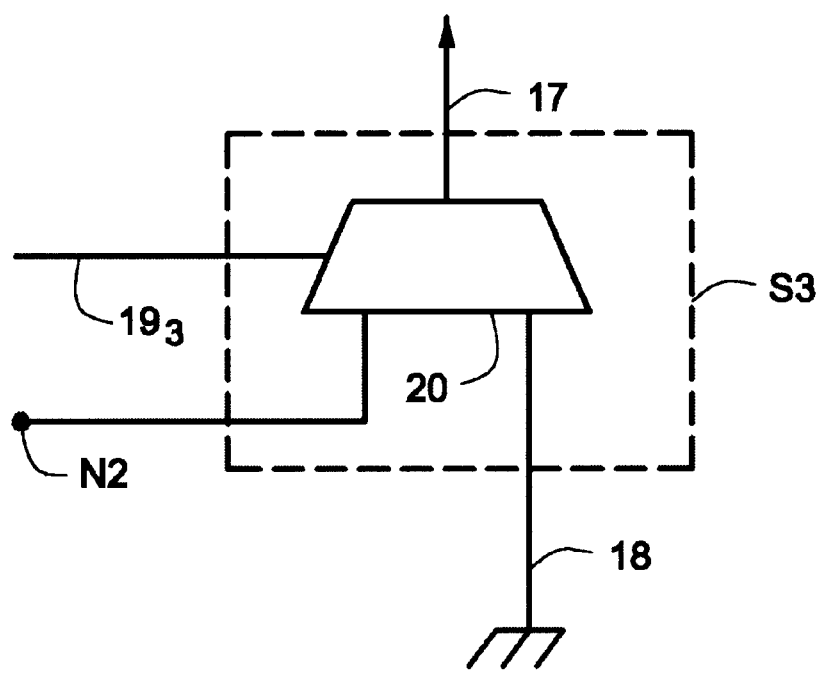
FIG. 9 is a diagram illustrating a multiplexer embodiment of a switch depicted in FIG. 2.
Figure 13:
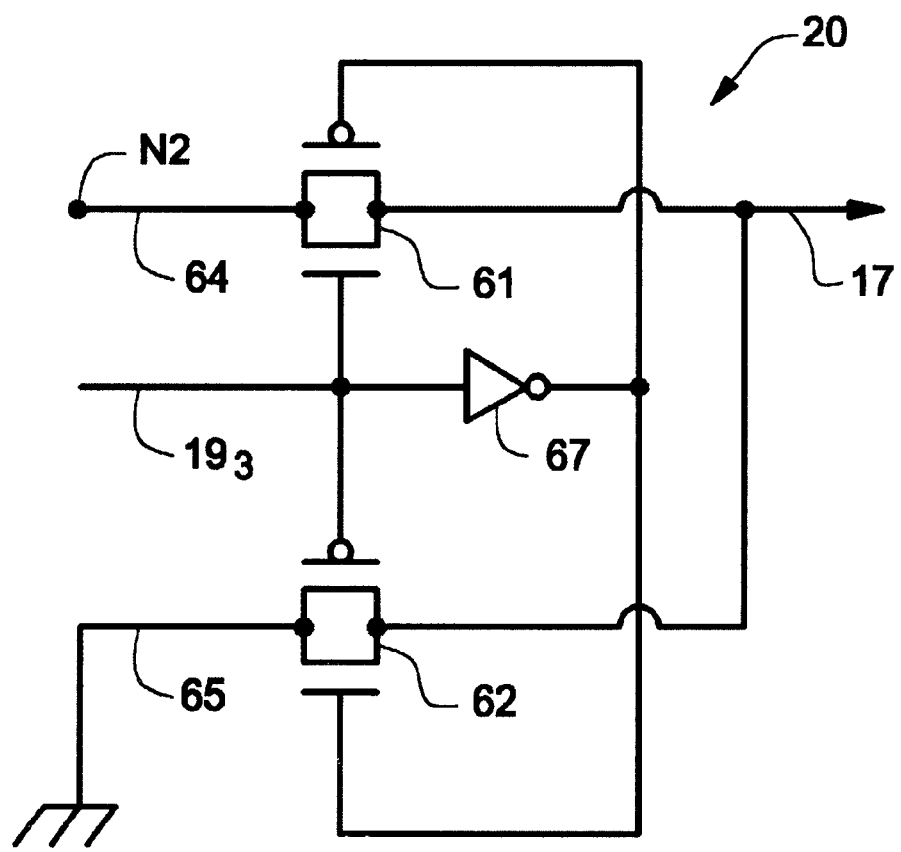
FIG. 13 is a diagram schematically illustrating the multiplexer depicted FIG. 9, according to one embodiment of the present invention.

FIG. 9 illustrates an implementation of switch S3 (FIG. 2), according to one embodiment of the present invention. In this embodiment, switch S3 is implemented with a two-input multiplexer 20. The output lead of multiplexer 20 is connected to bottom electrode 17 of trim capacitor C3. One input lead of multiplexer 20 is connected to node N2 and the other to GROUND via line 18. Other embodiments may use any suitable implementation of a single-pole-double-throw switch for switch S3. An implementation of a suitable multiplexer is schematically illustrated in FIG. 13.

Figure 10:
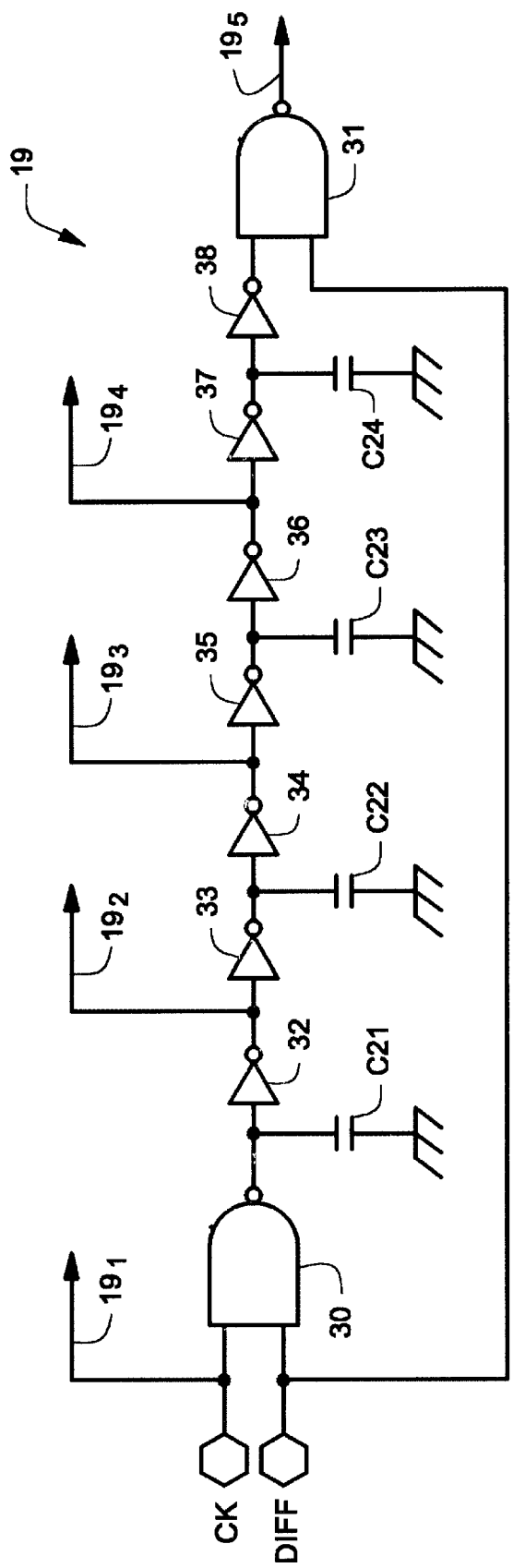
FIG. 10 is a diagram schematically illustrating the timing circuit of FIG. 2, according to one embodiment of the present invention.

FIG. 10 schematically illustrates timing circuit 19 (FIG. 2), according to one embodiment of the present invention. This embodiment of timing circuit 19 includes capacitors C21–C24, NAND gates 30 and 31, and inverters 32–38, which are interconnected as follows.

NAND gate 30 is a two-input NAND gate with one input lead being connected to receive the clock signal CK and the other input lead being connected to receive a control signal DIFF. Signals CK and DIFF are described in Table 2 below. Line 19₁ is also connected to receive clock signal CK, which therefore serves as the control signal to switch S1 (FIG. 2). The output lead of NAND gate 30 is connected to the input lead of inverter 32.

Inverters 32–38 are connected in series, with inverter 32 being connected to inverter 33, which is connected to inverter 34 and so on to inverter 38. The output lead of inverter 38 is connected to an input lead of two-input NAND gate 31. The other input lead of NAND gate 31 is connected to receive control signal DIFF.

As described above, control line 19₁ is connected to receive clock signal CK. Control lines 19₂–19₅ are connected to the output leads of inverter 32, inverter 34, inverter 36 and NAND gate 31, respectively.

Capacitors C21, C22, C23 and C24 respectively connect the input leads of inverters 32, 33, 35 and 37 to GROUND. In conjunction with the propagation delay through inverters 32–38, capacitors C21–C24 generate delays D1–D4 described above.

TABLE 2

| SIGNAL | DESCRIPTION |
|---|---|
| CK | A clock signal used to sample and hold the input differential voltage and trigger translation to a ground-referenced voltage. |
| DIFF | A control signal that enables/disables the timing circuit to control the translation process. |

This embodiment of timing circuit 19 operates as follows. When control signal DIFF is de-asserted (i.e., at a logic zero level in this embodiment), timing circuit 19 is disabled. However, when signal DIFF is asserted (i.e., at a logic one level in this embodiment), timing circuit 19 is enabled. In this embodiment, a logic one level of signal DIFF causes NAND gates 30 and 39 to function as inverters.

The timing for the translation process is generated as follows. This description is started with signals CK and DIFF at logic one levels and the voltage levels at control lines 19₁–19₅ being at steady state levels. In this state, the logic one level of clock signal CK is propagated directly to switch S1 through line 19₁. In addition, control line 19₂ is at a logic one, level because the logic one level of clock signal CK is inverted twice (by NAND gate 30 and inverter 32) in being propagated to control line 19₂. The voltage at control line 19₃ is at a logic one level because the logic one level of clock signal CK is inverted four times (NAND gate 30 and inverters 32, 33 and 34). The voltage at control line 19₄ is at a logic one level because the logic one level of clock signal CK is inverted six times (NAND gate 30 and inverters 32–36). The voltage at control line 19₅ is at a logic zero level because the logic one level of clock signal CK is inverted nine times (NAND gate 30, inverters 32–38, and NAND gate 39). Consequently, the logic levels at control lines 19₁–19₅ are logic one, logic one, logic one, logic one, and logic zero, respectively. These control signal logic levels cause switches S1 and S2 to be closed, switch S3 to electrically connect bottom electrode 17 to node N2, switch S4 to be closed and switch S5 to be open, as shown in FIG. 3.

When the voltage level of clock signal CK transitions to a logic zero level, the voltage level at control line 19₁ immediately transitions to a logic zero level. This logic zero level causes switch S1 to open, as shown in FIG. 4.

After the logic level transition of clock signal CK, the voltage level at control $19_2$ transitions to logic zero level after delay D1, which results from the delay in charging capacitor C21 and the delay through NAND gate 30 and inverter 32. This logic zero level causes switch S2 to open, as shown in FIG. 5.

After the logic level transition of the voltage at control $19_2$, the voltage level at control $19_3$ transitions to a logic zero level after delay D2, which results from the delay in charging capacitor C22 and the delay through inverters 33 and 34. This logic zero level causes switch S3 to electrically connect bottom electrode 17 to GROUND, as shown in FIG. 6.

After the logic level transition at control $19_3$, the voltage at control $19_4$ transitions to a logic zero level after delay D3, which results from the delay in charging capacitor C23 and the delay through inverters 35 and 36. This logic zero level causes switch S4 to open, as shown in FIG. 7.

After the logic level transition at control line $19_4$, the voltage at control line $19_5$ transitions to a logic one level after delay D4, which results from the delay in charging capacitor C24 and the delay through NAND gate 31 and inverters 37 and 38. This logic one level causes switch S5 to close, as shown in FIG. 8.

Figure 11:
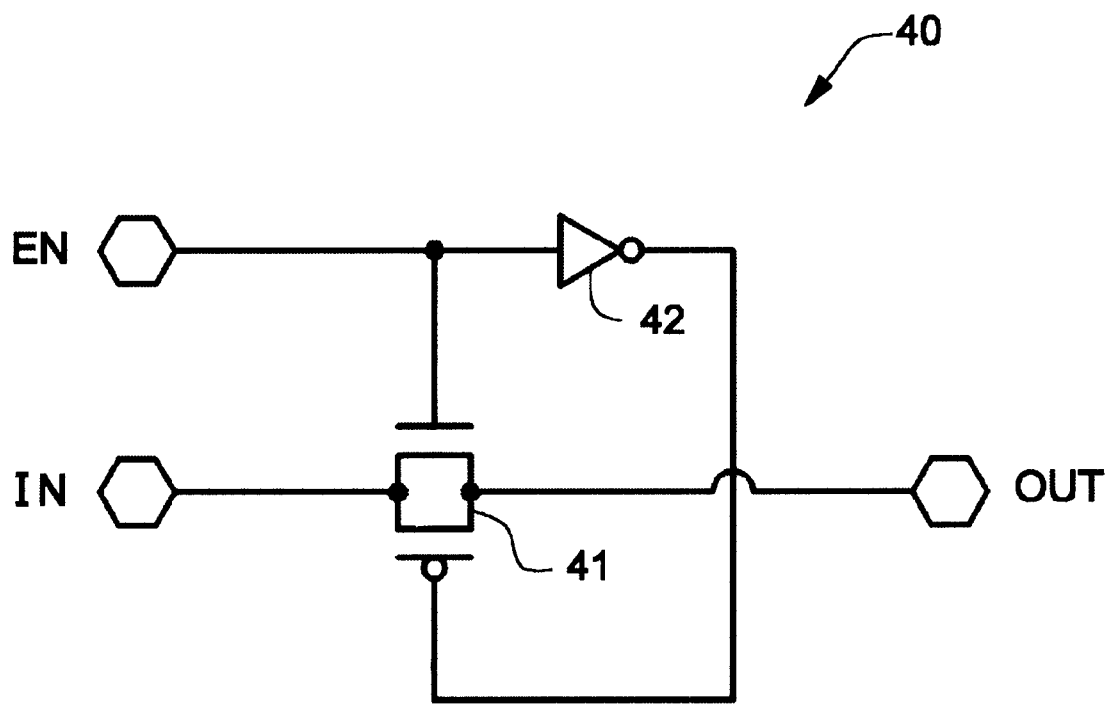
FIG. 11 is a diagram schematically illustrating a switch depicted FIG. 2, according to another embodiment of the present invention.

FIG. 11 schematically illustrates a switch 40 used to implement switches S2 and S5 (FIG. 2), according to one embodiment of the present invention. This embodiment of switch 40 includes a transmission gate 41 and inverter 42. The n-channel and p-channel devices of transmission gate 41 have relatively large width-to-length ratios (e.g., 4 $\mu$m-to-500 mn) to enable relatively fast operation.

Figure 12:
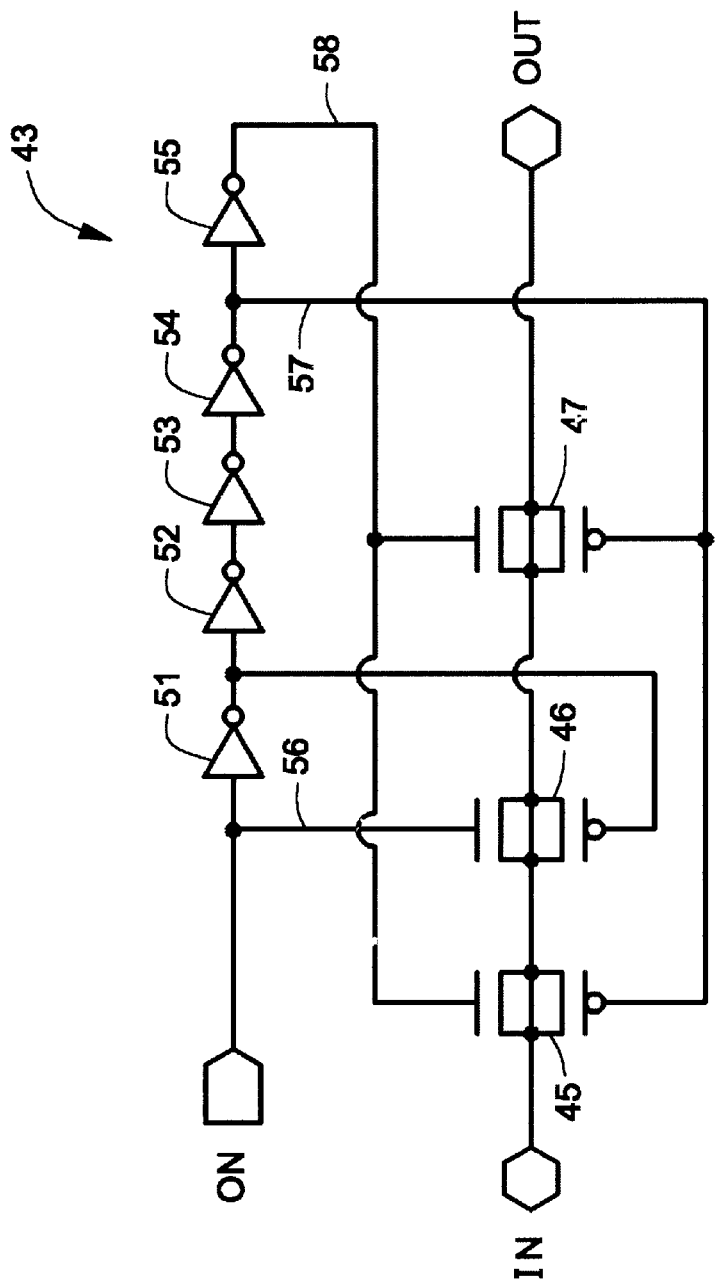
FIG. 12 is a diagram schematically illustrating a switch depicted FIG. 2, according to yet another embodiment of the present invention.

FIG. 12 schematically illustrates a switch 43 used to implement switches S1 and S4 (FIG. 2), according to one embodiment of the present invention. This embodiment of switch 43 includes transmission gates 45–47 and inverters 51–55. Transmission gates 45–47 are connected in series, with gates 45 and 47 being dummy gates that have their source/drain terminals shorted together so that they always conduct. These dummy transmission gates are used to help prevent charge accumulations from the channel regions of transmission gate 46 (arising from the turning on and off of the transmission gate) from redistributing to S/H capacitor C1 (FIG. 2). That is, the charge accumulations from turning transmission gate 46 on and off are balanced out by opposite charge accumulations of dummy transmission gates 45 and 47.

Inverters 51–55 are connected in series to create a delay circuit. More particularly, the control leads of transmission gate 46 are connected to the control line 56 (which receives the control signal directly) and inverter 51, whereas the control leads of transmission gates 45 and 47 are connected to the output leads of inverters 54 and 55. The control leads for transmission gates 45–47 are connected so that in steady state, the channel regions of transmission gates 45 and 47 are off (however, the gates are still conductive due to the shorts) when transmission gate 46 is on, and vice versa. However, transmission gate 46 will transition before dummy transmission gates 45 and 47 due to the propagation delay of inverters 51–53. The delay intransitioning the dummy transmission gates helps ensure that charge accumulations from the channel regions of the dummy transmission gate do not flow out of switch 43 but rather will balance out charge accumulations in transmission gate 46. In this embodiment, transmission gates 45 and 47 have the same width-to-length ratio, with transmission gate 46 having about twice the width-to-length ratio as that of transmission gate 45 so that charge accumulations in transmission gate 46 will, ideally, be balanced out by dummy transmission gates 45 and 47. In this exemplary embodiment, the width-to-length ratio of the dummy transmission gates is relatively small (e.g., 1.1 $\mu$m-to-500 nm) compared to the transmission gates of switch 40 (FIG. 11). The sizes of the devices implementing the inverters and NAND gates of FIGS. 8–10 are of the same width-to-length ratios. In other embodiments, the width-to-length ratios of the various devices can be different from those described above in conjunction with FIGS. 8–13), depending on the semiconductor process parameters, the application, the desired speed, the voltage range, capacitances, etc.

FIG. 13 schematically illustrates an implementation of multiplexer 20 (FIG. 9), according to one embodiment of the present invention. This implementation is a standard multiplexer implementation using transmission gates 61 and 62, which have input leads 64 and 65 that are connected to node N2 and GROUND, respectively. Control $19_3$ is connected to an inverter 67 and transmission gates 61 and 62. In particular, control $19_3$ is connected to the n-channel device of transmission gate 61 and to the p-channel device of transmission gate 62. The output lead of inverter 67 is connected to the n-channel device of transmission gate 62 and to the p-channel device of transmission gate 61. Thus, transmission gate 61 will be conductive while transmission gate 62 is non-conductive and vice versa. The sizes of the devices implementing transmission gates 61 and 62 are the same as those implementing transmission gate 45 (FIG. 12).

The above specification, examples and data provide a complete description of the manufacture and use of the composition of the invention. Because many embodiments of the invention can be made without departing from the spirit and scope of the invention, the invention resides in the claims hereinafter appended.

We claim:

1. A circuit for translating a differential voltage to a ground-referenced voltage, the circuit comprising:
    a differential input circuit having a first terminal and a second terminal, wherein the differential input circuit is configurable to receive a differential voltage;
    a sample and hold (S/H) circuit coupled to the differential input circuit, wherein the S/H circuit is configured to sample a differential voltage received at the differential input circuit and wherein the S/H circuit is configured to selectively provide a conductive path between the second terminal and a source of ground potential (GROUND); and
    a compensation circuit coupled to the S/H circuit, wherein the compensation circuit includes a trim capacitor that is configured to compensate for a voltage change caused by parasitic capacitance in the circuit.

2. The circuit of claim 1 wherein the differential input circuit includes a first switch and a second switch, wherein the first and second switches are respectively configured to selectively provide a conductive path between the first and second terminals to first and second nodes of the S/H circuit.

3. The circuit of claim 1 wherein the equivalent capacitance of the trim capacitor and other devices of the circuit coupled to the trim capacitor is equal to the parasitic capacitance.

4. The circuit of claim 1 wherein the compensation circuit includes a third switch coupled to the trim capacitor, the S/H circuit, and to GROUND, wherein the third switch is configured to selectively provide a conductive path between the trim capacitor and GROUND and selectively provide a conductive path between the trim capacitor and the second node of the S/H circuit.

5. The circuit of claim 1 wherein the compensation circuit includes a fourth switch coupled to the trim capacitor and the first node of the S/H circuit, wherein the fourth switch is configured to selectively provide a conductive path between the trim capacitor and the first node of the S/H circuit.

6. The circuit of claim 1 wherein the S/H circuit includes a S/H capacitor connected between the first and second nodes of the S/H circuit and further includes a second capacitor connected to the second node of the S/H circuit and GROUND.

7. The circuit of claim 1 wherein the S/H circuit includes a fifth switch coupled to the second node of the S/H circuit and GROUND, wherein the fifth switch is configured to selectively provide a conductive path between the second node of the S/H circuit and GROUND.

8. A circuit for translating a differential voltage to a ground-referenced voltage, the differential voltage being provided across a first input terminal and a second input terminal, the circuit comprising:

a sample and hold (S/H) capacitor having a first electrode and a second electrode;

a first switch coupled to the first electrode and to the first input terminal;

a second switch coupled to the second electrode and the second input terminal;

a second capacitor coupled to the second electrode and a source of ground potential (GROUND);

a trim capacitor;

a third switch coupled to the trim capacitor, the second electrode and GROUND;

a fourth switch coupled to the trim capacitor and the first electrode;

a fifth switch coupled to the second electrode and GROUND; and a timing circuit coupled to the first, second, third, fourth and fifth switches.

9. The circuit of claim 8 wherein the third switch includes a multiplexer.

10. The circuit of claim 8 wherein the trim capacitor has a value such that the equivalent capacitance of the trim capacitor and other devices of the circuit coupled to the trim capacitor is equal to the parasitic capacitance.

11. The circuit of claim 8 wherein the timing circuit is configured to provide control signals to the first, second, third, fourth and fifth switches so the first, second, and fourth switches are closed, the third switch provides a conductive path between the trim capacitor and the second electrode, and the fifth switch is open, thereby causing the voltage across the S/H and trim capacitors to be equal to the differential voltage.

12. The circuit of claim 11 wherein the timing circuit is configured to open the first switch to isolate the first input terminal from the first electrode.

13. The circuit of claim 12 wherein the timing circuit is configured to open the second switch to isolate the second input terminal from the second electrode.

14. The circuit of claim 13 wherein the timing circuit is configured to cause the third switch to provide a conductive path between the trim capacitor to GROUND and to isolate the trim capacitor from the second electrode.

15. The circuit of claim 14 wherein the timing circuit is configured to open the fourth switch to isolate the trim capacitor from the first electrode.

16. The circuit of claim 15 wherein the timing circuit is configured to close the fifth switch to provide a conductive path from the second electrode to GROUND.

17. A circuit for translating a differential voltage to a ground-referenced voltage, the circuit comprising:

first means, having a first terminal and a second terminal, for receiving a differential voltage;

second means, coupled to the first means, for sampling a differential voltage received at the first and second terminals and for selectively providing a conductive path between the second terminal and a source of ground potential (GROUND); and third means, coupled to the second means, for compensating for a voltage change caused by parasitic capacitance in the circuit, the third means including a trim capacitor.

18. The circuit of claim 17 wherein the equivalent capacitance of the trim capacitor and other devices of the circuit coupled to the trim capacitor is equal to the parasitic capacitance.

\* \* \* \* \*